(12) United States Patent
Sakata et al.

(10) Patent No.: US 9,018,764 B2
(45) Date of Patent: Apr. 28, 2015

(54) SEMICONDUCTOR DEVICE HAVING BARRIER METAL LAYER

(71) Applicant: Kabushiki Kaisha Toshiba, Tokyo (JP)

(72) Inventors: Atsuko Sakata, Mie-ken (JP); Takeshi Ishizaki, Aichi-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/018,637

(22) Filed: Sep. 5, 2013

(65) Prior Publication Data

US 2014/0070417 A1     Mar. 13, 2014

(30) Foreign Application Priority Data

Sep. 10, 2012   (JP) ................................. 2012-198631

(51) Int. Cl.
| | |
|---|---|
| *H01L 23/48* | (2006.01) |
| *H01L 23/532* | (2006.01) |
| *H01L 23/485* | (2006.01) |
| *H01L 23/522* | (2006.01) |
| *H01L 21/28* | (2006.01) |
| *H01L 29/45* | (2006.01) |
| *H01L 29/49* | (2006.01) |

(Continued)

(52) U.S. Cl.
CPC ........ *H01L 23/53266* (2013.01); *H01L 23/485* (2013.01); *H01L 23/5226* (2013.01); *H01L 21/28273* (2013.01); *H01L 21/28061* (2013.01); *H01L 29/456* (2013.01); *H01L 29/4941* (2013.01); *H01L 21/28518* (2013.01); *H01L 23/53223* (2013.01); *H01L 23/53238* (2013.01); *H01L 21/76843* (2013.01); *H01L 21/76846* (2013.01); *H01L 21/76855* (2013.01); *H01L 21/76856* (2013.01); *H01L 2924/0002* (2013.01)

(58) Field of Classification Search
CPC ............ H01L 23/53266; H01L 23/485; H01L 23/5226
USPC .................................................. 257/751, 412
See application file for complete search history.

(56) References Cited

U.S. PATENT DOCUMENTS

| | | | |
|---|---|---|---|
| 6,686,277 | B1 | 2/2004 | Tai |
| 6,818,935 | B2 | 11/2004 | Kweon et al. |

(Continued)

FOREIGN PATENT DOCUMENTS

| | | |
|---|---|---|
| JP | 05-259110 | 10/1993 |
| JP | 08-045878 | 2/1996 |

(Continued)

*Primary Examiner* — Tu-Tu Ho

(74) *Attorney, Agent, or Firm* — Finnegan, Henderson, Farabow, Garrett & Dunner, L.L.P.

(57) ABSTRACT

According to one embodiment, a semiconductor device having an interlayer insulating film, a molybdenum containing layer, a barrier metal layer and a plug material layer is provided. The interlayer insulating film is formed on a substrate or on a conductive layer formed on a substrate. The interlayer insulating film has a hole reaching the substrate or the conductive layer. The molybdenum containing layer is formed in the substrate or in the conductive layer at a bottom portion of the hole. The barrier metal layer is formed on the molybdenum containing layer and on a side surface of the hole. A portion of the barrier metal layer is formed on the side surface contains at least molybdenum. A portion of the barrier metal layer is formed on the molybdenum containing layer includes at least a molybdenum silicate nitride film. The plug material layer is formed via the barrier metal layer.

3 Claims, 14 Drawing Sheets

(51) Int. Cl.
*H01L 21/285* (2006.01)
*H01L 21/768* (2006.01)

(56) References Cited

U.S. PATENT DOCUMENTS

| | | | |
|---|---|---|---|
| 7,977,751 B2 | 7/2011 | Nagaoka et al. | |
| 2005/0164441 A1* | 7/2005 | Ohnishi et al. | 438/201 |
| 2007/0164280 A1 | 7/2007 | Maekawa et al. | |
| 2008/0042118 A1 | 2/2008 | Hayakawa | |

FOREIGN PATENT DOCUMENTS

| | | |
|---|---|---|
| JP | 09-055427 | 2/1997 |
| JP | 2673673 B | 7/1997 |
| JP | 10-289885 | 10/1998 |

\* cited by examiner

SEMICONDUCTOR DEVICE HAVING BARRIER METAL LAYER

CROSS-REFERENCE TO RELATED APPLICATION

This application is based upon and claims the benefit of priority from the prior Japanese Patent Application No. 2012-198631, filed on Sep. 10, 2012, the entire contents of which are incorporated herein by reference.

FIELD

Embodiments described herein relate generally to a semiconductor device having a barrier metal layer.

BACKGROUND

In order to reduce wiring resistance and manufacturing cost of LSI, it is preferable that a plug interconnection be formed of a plug material and a barrier metal material with low resistance and low cost. An example of the plug material may be copper (Cu). In addition, an example of the barrier metal material may be tungsten nitride (WN). When tungsten (W) is used as the plug material, main components of the plug material and the barrier metal material are the same metal so that the manufacturing cost is further reduced. However, when a tungsten nitride film is formed on a silicon (Si) substrate as the barrier metal material, silicon nitride is stable more than tungsten nitride. Formation of the tungsten nitride film may cause a problem that a silicon nitride film is formed in the silicon substrate so that electrical contact can not be obtained between the silicon substrate and the plug interconnection. The same problem may occur when an interconnection other than the plug interconnection, or an electrode such as a gate electrode, a floating gate, and a control gate is formed.

DETAILED DESCRIPTION

Figure 1:
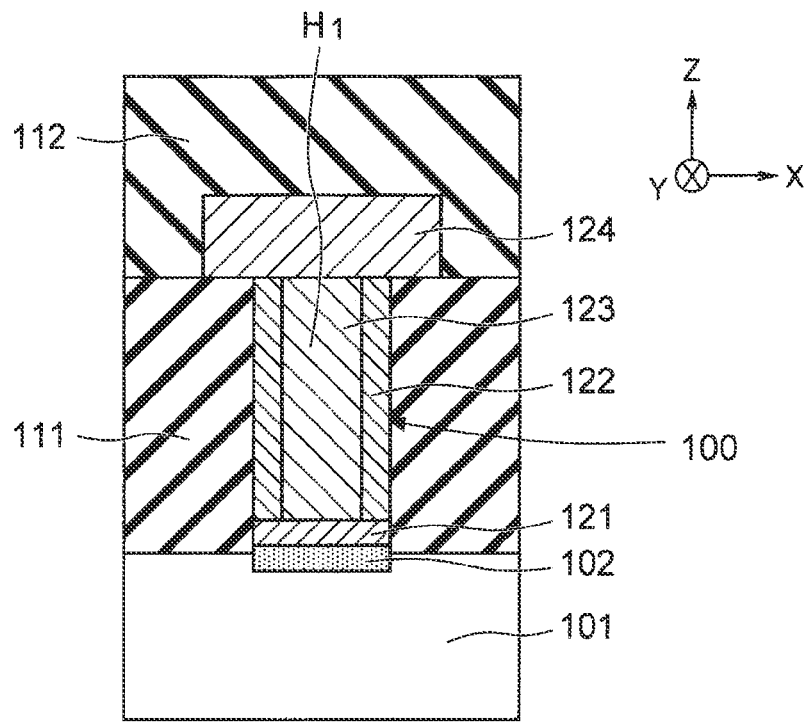
FIG. 1 is a cross-sectional view of a semiconductor device of a first embodiment.

According to one embodiment, a semiconductor device having an interlayer insulating film, a molybdenum containing layer, a barrier metal layer and a plug material layer is provided. The interlayer insulating film is formed on a substrate or on a conductive layer containing silicon formed on a substrate. The interlayer insulating film has a hole reaching the substrate or the conductive layer. The molybdenum containing layer is formed in the substrate or in the conductive layer at a bottom portion of the hole. The barrier metal layer is formed on the molybdenum containing layer and on a side surface of the hole. A portion of the barrier metal layer is formed on the side surface contains at least molybdenum. A portion of the barrier metal layer is formed on the molybdenum containing layer includes at least a molybdenum silicate nitride film. The plug material layer is formed in the hole through the barrier metal layer.

Hereinafter, further embodiments will be described with reference to the drawings.

In the drawings, the same reference numerals denote the same or similar portions respectively.

A first embodiment will be described with reference to FIG. 1.

FIG. 1 is a cross-sectional view illustrating a structure of a semiconductor device according to a first embodiment which focuses a cross section of a contact plug 100 constituting the semiconductor device.

The semiconductor device of FIG. 1 has a substrate 101, a molybdenum silicide layer (hereinafter referred to as "MoSi$_X$ layer") 102, interlayer insulating films 111, 112, a molybdenum silicate nitride film (hereinafter referred to as "MoSiON film") 121, a molybdenum oxynitride film (hereinafter referred to as "MoON film") 122, a plug material layer 123, and a wiring layer 124. The contact plug 100 is configured by the MoSi$_X$ layer 102, the MoSiON film 121, the MoON film 122, and the plug material layer 123.

For example, the substrate 101 is a semiconductor substrate such as a silicon (Si) substrate. FIG. 1 illustrates an X direction, a Y direction and a Z direction. The X direction and the Y direction are parallel to a main surface of the substrate 101 and perpendicular to each other. The Z direction is parallel to the main surface of the substrate 101. The substrate 101 may be an SOI (Semiconductor On Insulator) substrate in which an embedded insulating film and a semiconductor layer are formed on a semiconductor substrate in this order. An example of the semiconductor substrate and the semiconductor layer may be a silicon (Si) layer.

The interlayer insulating films 111, 112 are formed on the substrate 101 in this order. The interlayer insulating film 111 has a contact hole H$_1$ formed to reach the substrate 101. The interlayer insulating films 111, 112 are, for example, a silicon dioxide film (SiO$_2$).

The MoSi$_X$ layer 102 is formed to extend into a surface region of the substrate 101 from a bottom portion of the contact hole H$_1$. In other words, the MoSi$_X$ layer 102 is formed on a surface region of the substrate. The MoSi$_X$ layer 102 is a molybdenum containing layer.

The MoSiON film 121 is formed on the MoSi$_X$ layer 102 at the bottom portion of the contact hole H$_1$. The MoSiON film 121 is denoted by a $Mo_{X1}Si_{X2}O_{X3}N_{X4}$ film 121, specifically. The MoON film 122 is formed on a side surface of the contact hole $H_1$. The MoSiON film 121 and the MoON film 122 compose a barrier metal layer containing molybdenum.

The plug material layer 123 is formed in the contact hole $H_1$ through the MoSiON film 121 and the MoON film 122 to be embedded inside the contact hole $H_1$. The plug material layer 123 is, for example, a molybdenum (Mo) layer.

The wiring layer 124 is formed on the plug material layer 123 and the interlayer insulating film 111. The wiring layer 124 is, for example, a copper (Cu) layer or an aluminum (Al) layer. The wiring layer 124 is covered with the interlayer insulating film 112.

Figure 2:
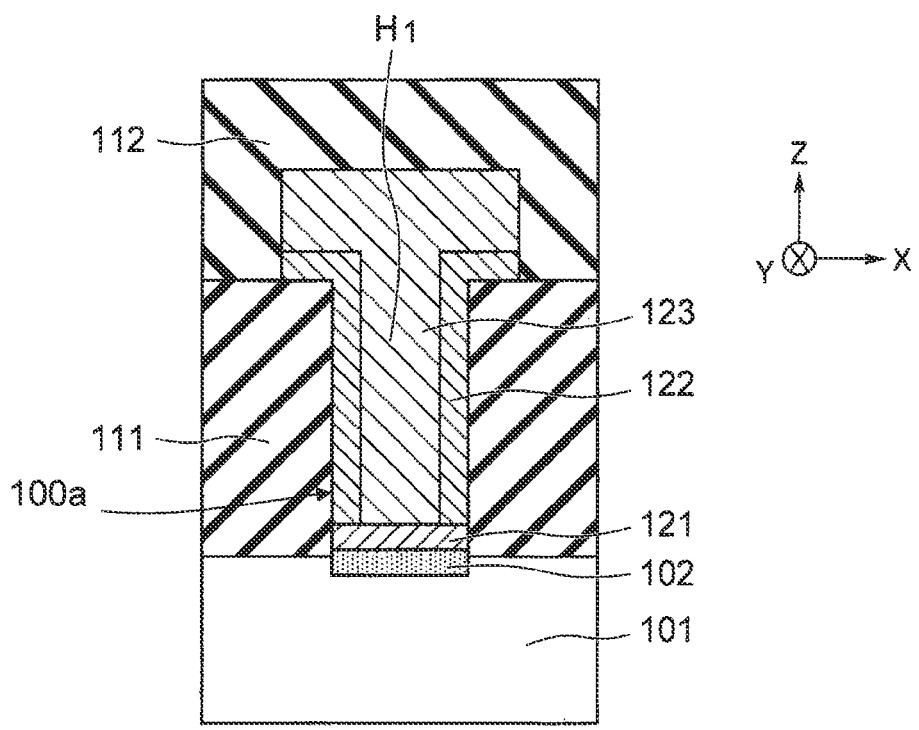
FIG. 2 is a cross-sectional view illustrating a semiconductor device of a modification of the first embodiment.

The wiring layer 124 shown in FIG. 1 may be formed of the same material as that of the plug material layer 123, as illustrated in FIG. 2. FIG. 2 is a cross-sectional view illustrating a structure of a semiconductor device of a modification of the first embodiment described above. According to the structure of a contact plug 100a of FIG. 2, it is possible to reduce the number of manufacturing steps and the cost of wiring process.

A method of manufacturing the semiconductor device according to the first embodiment will be described with reference to FIG. 3A to FIG. 3I.

FIG. 3A to FIG. 3I are cross-sectional views illustrating steps of the method of manufacturing the semiconductor device according to the first embodiment.

Figure 3A:
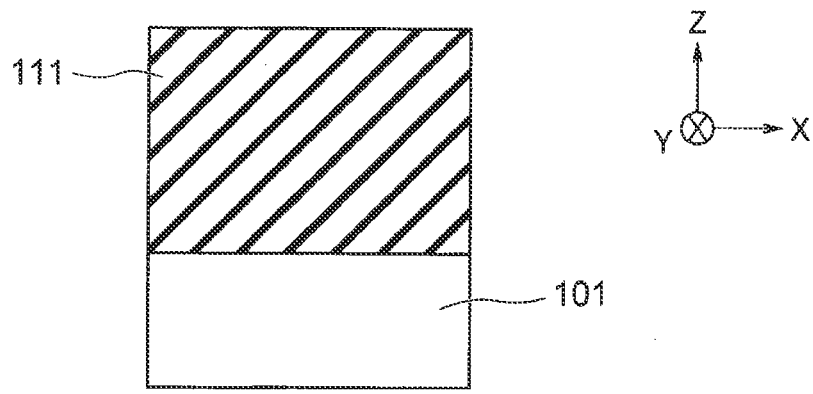
FIG. 3A to FIG. 3I are cross-sectional views illustrating steps of a method of manufacturing the semiconductor device according to the first embodiment.

As illustrated in FIG. 3A, an interlayer insulating film 111 is formed on a substrate 101, and a surface of the interlayer insulating film 111 is flattened by chemical mechanical polishing (CMP).

Figure 3B:
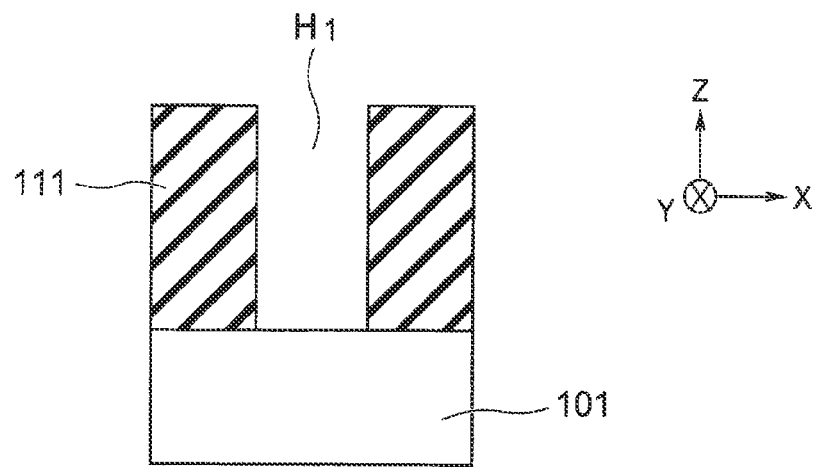

In addition, as illustrated in FIG. 3B, a contact hole $H_1$ reaching the substrate 101 is formed in the interlayer insulating film 111.

Figure 3C:
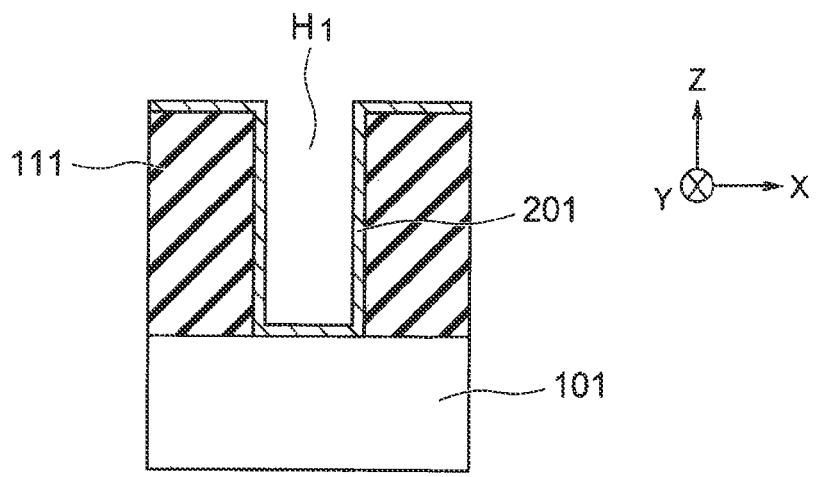

Then, as illustrated in FIG. 3C, a MoN film (a molybdenum nitride film) 201 is laminated on a whole surface including a portion of the main surface of the substrate 101 by physical vapor deposition (PVD), chemical vapor deposition (CVD) or atomic layer deposition (ALD). The MoN film 201 is formed on a bottom surface and a side surface of the contact hole $H_1$.

Figure 3D:
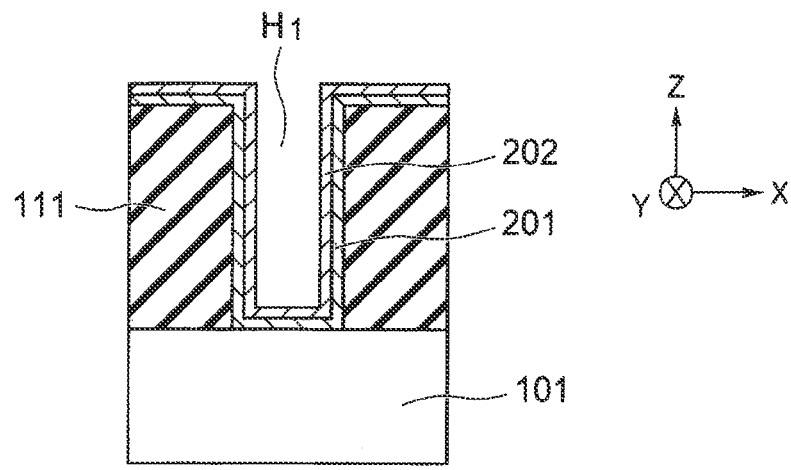

As illustrated in FIG. 3D, the surface of the MoN film 201 is oxidized to form a $MoO_X$ film (a molybdenum oxide film) 202 on the surface of the MoN film 201. The $MoO_X$ film 202 is formed on the bottom surface and the side surface of the contact hole $H_1$ through the MoN film 201. A laminated film including the MoN film 201 and the $MoO_X$ film 202 composes a barrier metal layer containing molybdenum.

The lamination process for the MoN film 201 and the oxidation process for the surface of the MoN film 201 may be performed in the same chamber, or may be performed in separate chambers connected commonly to a spare chamber which can be vacuumized. The chambers may be released to the atmosphere between the processes.

The oxidation process for the surface of the MoN film 201 is performed at the same temperature as that of the lamination process for the MoN film 201, for example, at a temperature equal to or higher than 400° C., in an atmosphere of decompression or atmospheric pressure. Hereinafter, a heat treatment at the oxidation process is referred to as a first heat treatment. The oxidation process for the surface of the MoN film 201 may be performed using plasma.

Figure 3E:
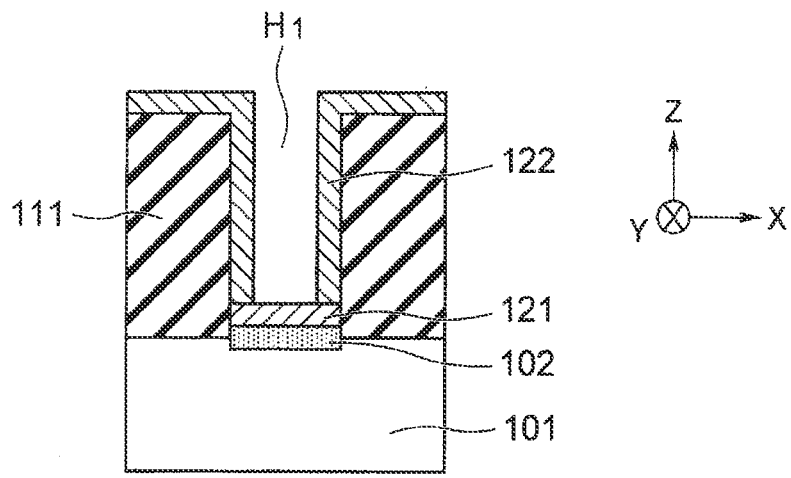

Then, as illustrated in FIG. 3E, a heat treatment of the substrate 101 is performed at a temperature higher than the temperature of the first heat treatment, for example, at a temperature equal to or high than 500° C. As a result, a $MoSi_X$ layer 102 is formed to extend into a surface region of the substrate 101 from the bottom portion of the contact hole $H_1$. In other words, the $MoSi_X$ layer 102 is formed on a surface region of the substrate 101. Further, by the heat treatment, the MoN film 201 and the $MoO_X$ film 202 are changed into a MoON film 122, and silicon contained in the substrate 101 is also diffused into a portion of the MoON film 122 existing on the bottom portion of the contact hole $H_1$. Accordingly, a MoSiON film 121 and the MoON film 122 are formed on the bottom portion and on the side surface of the contact hole $H_1$, respectively. Hereinafter, the heat treatment is referred to as a second heat treatment.

The first and the second heat treatment may be integrated into one heat treatment. In this case, the heat treatment is performed, for example, at a temperature equal to or higher than 500° C. In this case, the process of oxygenating the surface of the MoN film 201, the process of forming the $MoSi_X$ layer 102, and the process of changing the MoN film 201 and the $MoO_X$ film 202 into the MoSiON film 121 and the MoON film 122 progress simultaneously. It is possible to reduce the number of heat treatments by such a heat treatment.

Figure 3F:
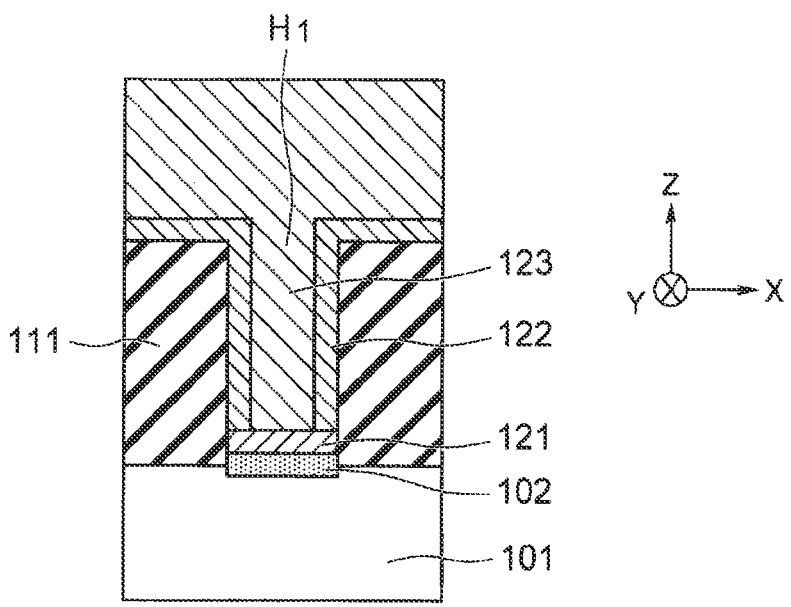
Figure 3G:
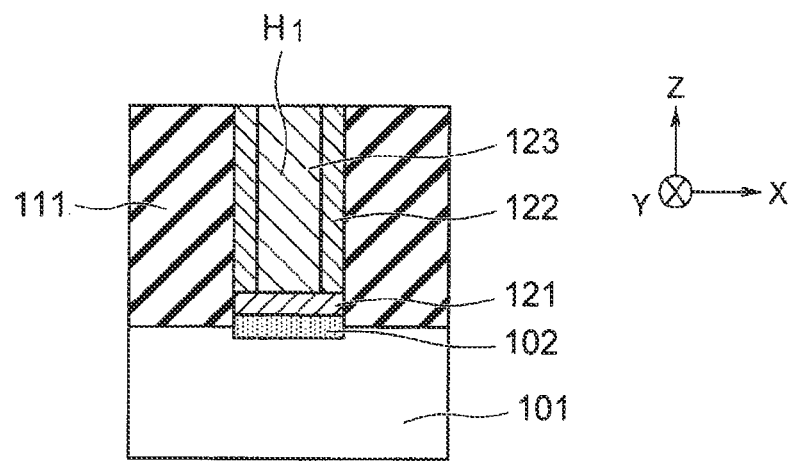

As illustrated in FIG. 3F, a material of a plug material layer 123 is laminated on a whole surface including a portion of the main surface of the substrate 101 by CVD. The material of a plug material layer 123 is formed to includ the inside of the contact hole $H_1$. In addition, as illustrated in FIG. 3G, the surface of the material is flattened by CMP. As a result, the plug material layer 123 is formed in the contact hole $H_1$ via the MoSiON film 121 and the MoON film 122. A surplus portion of the MoON film 122 formed outside the contact hole $H_1$ is removed by the flattening in the step of FIG. 3G.

Figure 3H:
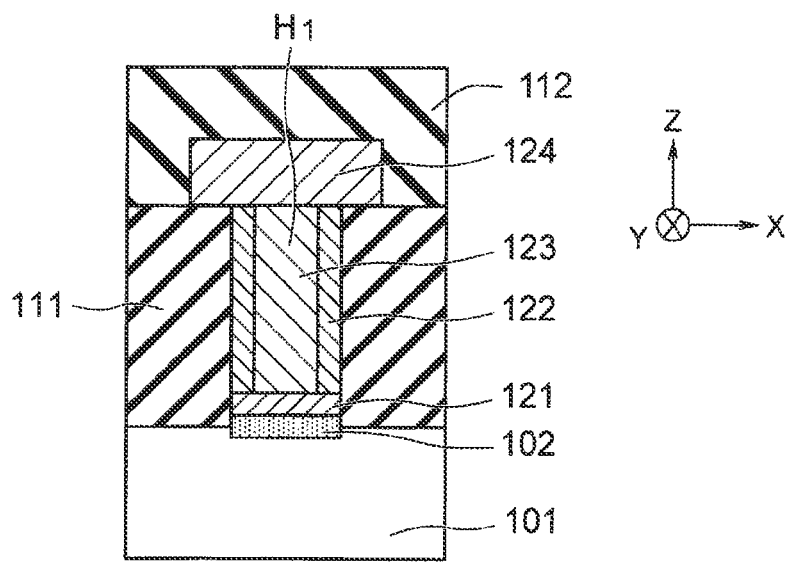

Then, as illustrated in FIG. 3H, a wiring layer 124 is formed on the plug material layer 123 and the interlayer insulating film 111. As illustrated in FIG. 3H, an interlayer insulating film 112 is formed on the whole surface to cover the wiring layer 124. Subsequently, various via-plugs, wiring layers, and interlayer insulating films are formed. In such a manner, the semiconductor device shown in FIG. 1 is manufactured.

Figure 3I:
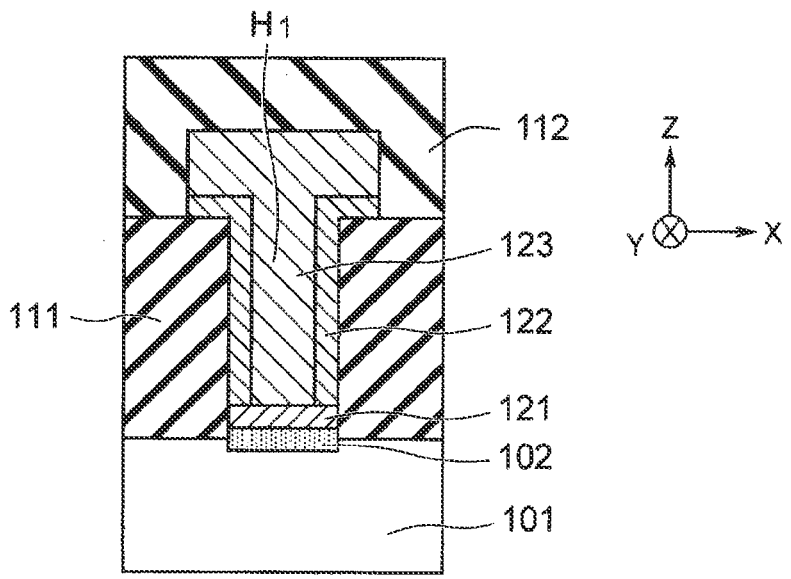

Alternatively, as illustrated in FIG. 3I, a wiring layer corresponding to the wiring layer 124 of FIG. 3H may be formed of the same material as that of the plug material layer 123 simultaneously with formation of the plug material layer 123, after the step of FIG. 3E. In this case, the semiconductor device of FIG. 2 is manufactured. In this case, as illustrated in FIG. 3I, a portion of the plug material layer 123 corresponding to the wiring layer 124 of FIG. 3H is formed above the interlayer insulating film 111 partially via the MoON film 122. The MoON film 122 is formed in the same pattern as the plug material layer 123 by etching.

The step of FIG. 3E will be described in detail with reference to FIG. 4. Specifically, the reason why the $MoSi_X$ layer 102 is formed to extend into the surface region of the substrate 101 from the bottom portion of the contact hole $H_1$, and the reason why the MoN film 201 and the $MoO_X$ film 202 are changed into the MoSiON film 121 and the MoON film 122 will be described.

Figure 4:
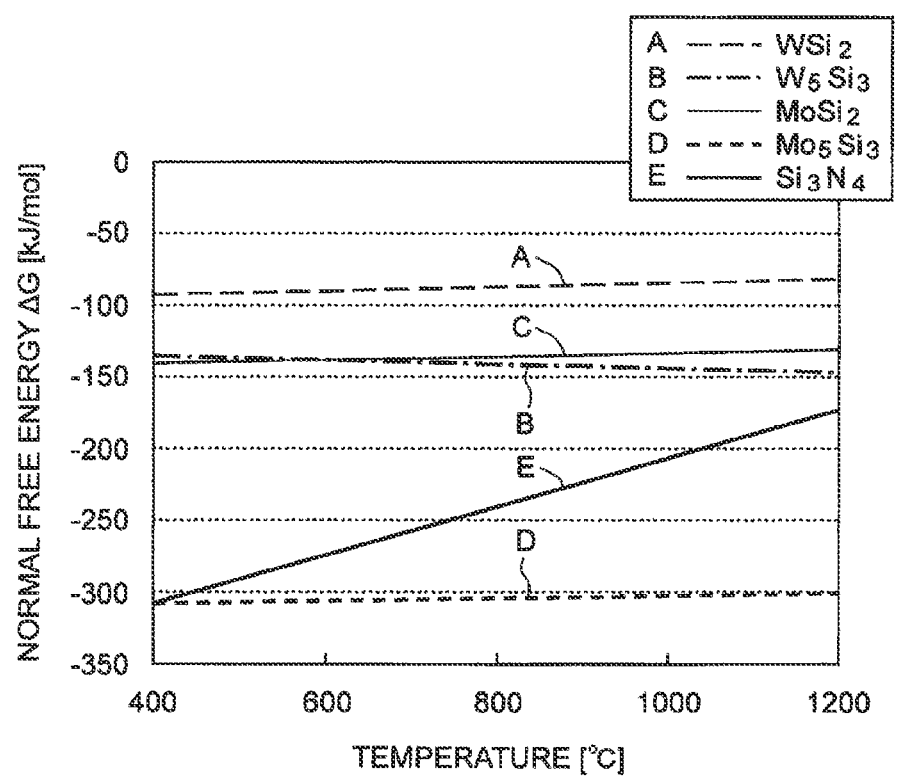
FIG. 4 is a graph illustrating change of standard free energy of various kinds of silicide with temperature.

FIG. 4 is a graph illustrating temperature characteristics of standard free energy $\Delta G$ of various kinds of silicide.

In FIG. 4, straight lines A to E represent standard free energy $\Delta G$ of $WSi_2$, $W_5Si_3$, $MoSi_2$, $Mo_5Si_3$, and $Si_3N_4$, respectively. As illustrated in FIG. 4, both of $\Delta G$ of $WSi_2$ and $W_5Si_3$ are larger than $\Delta G$ of $Si_3N_4$. Thus, when a WN film is formed on a silicon (Si) substrate, SiN is stabilized more than WN and the SiN film is formed in the silicon substrate accordingly. As result, electrical contact can not be obtained between the silicon substrate and the contact plug. WN cannot be used as a barrier metal material to be used when a contact plug is formed on a silicon substrate.

ΔG of $Mo_5Si_3$ becomes smaller than ΔG of $Si_3N_4$ at about 400° C. or higher. Accordingly, when a MoN film is formed on a silicon substrate at about 400° C. or higher, it is possible to avoid forming a SiN film in a silicon substrate. Accordingly, in the embodiment, the lamination process for the MoN film 201 of FIG. 3D is performed at 400° C. or higher.

In this case, MoN is unstable in energy. Accordingly, when a contact plug is formed of a MoN film and a molybdenum (Mo) layer as a plug material layer, both of the MoN film and the molybdenum layer become silicide. In the embodiment, in order to suppress such silicidation, the surface of the MoN film 201 is oxidized to form the $MoO_X$ film 202 as illustrated in FIG. 3D.

As illustrated in FIG. 3E, the MoN film 201 and the $MoO_X$ film 202 of FIG. 3D are changed into the MoON film 122 and the MoSiON film 121 and are stabilized. Nitrogen (N) atoms and oxygen (O) atoms in the MoON film 122 and the MoSiON film 121 are derived from nitrogen atoms contained in the MoN film 201 and oxygen atoms contained in the $MoO_X$ film 202. In addition, silicon (Si) atoms of the MoSiON film 121 are silicon atoms which are diffused from the silicon substrate 101.

Molybdenum atoms contained in the MoN film 201 in the vicinity of the silicon substrate 101 are diffused into the silicon substrate 101 to form the $MoSi_X$ layer 102.

Accordingly, in the step of FIG. 3E, the $MoSi_X$ layer 102 is formed to extend into the surface region of the substrate 101 from the bottom portion of the contact hole $H_1$, and the MoN film 201 and the $MoO_X$ film 202 are changed into the MoSiON film 121 and the MoON film 122.

Figure 5:
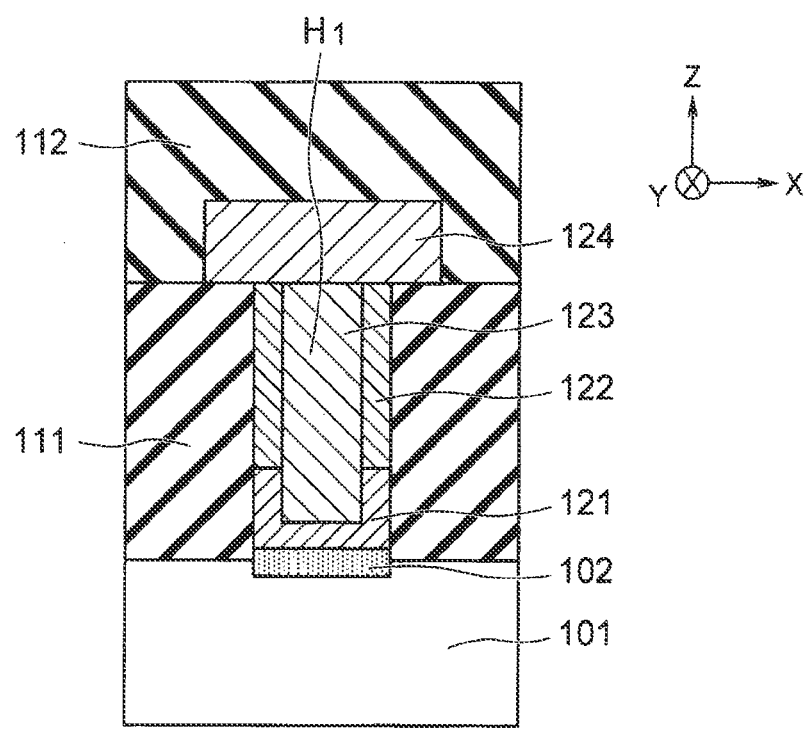
FIG. 5 is a cross-sectional view of a semiconductor device of another modification of the first embodiment.

FIG. 5 is a cross-sectional view illustrating a structure of a semiconductor device of another modification of the first embodiment. In the step of FIG. 3E, silicon atoms in the silicon substrate 101 may be diffused to the MoON film 122 of the side surface of the contact hole $H_1$. In this case, a semiconductor device illustrated in FIG. 5 is manufactured. In FIG. 5, a MoSiON film 121 is formed on the bottom portion of a contact hole $H_1$ and on a portion of the side surface of the contact hole $H_1$.

Figure 6:
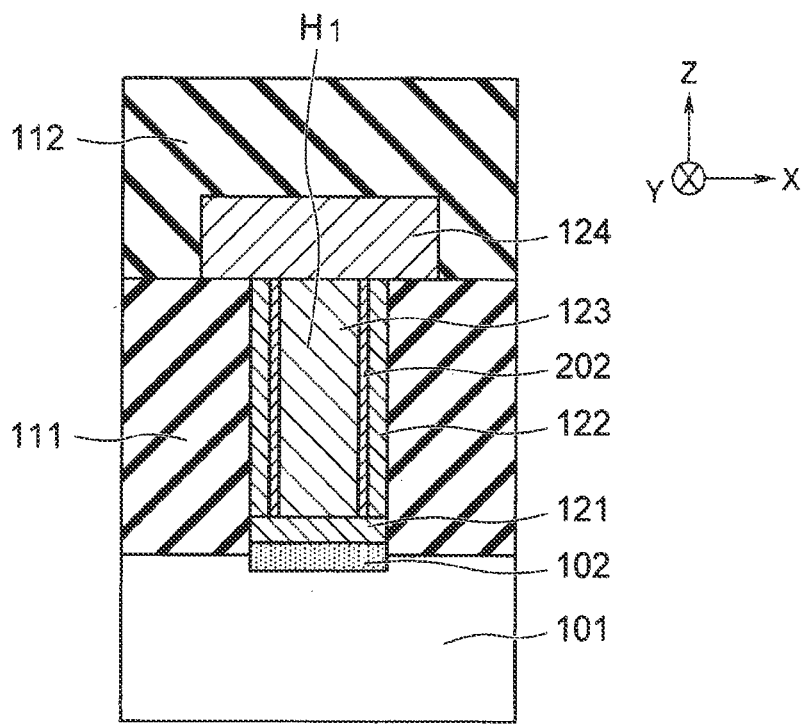
FIG. 6 is a cross-sectional view illustrating a semiconductor device of still another modification of the first embodiment.

FIG. 6 is a cross-sectional view illustrating a structure of still another modification of the first embodiment. In the step of FIG. 3E, there is a case in which the MoN film 201 and the $MoO_X$ film 202 shown in FIG. 3D are not changed into the MoSiON film 121 and the MoON film 122 wholly but a portion of the $MoO_X$ film 202 remains. In this case, a semiconductor device illustrated in FIG. 6 is manufactured. In FIG. 6, a portion of the $MoO_X$ film 202 remains between a MoON film 122 and a plug material layer 123.

The MoON film may be formed as the barrier metal layer in the steps of FIGS. 3C and 3D, instead of forming the laminated film including the MoN film 201 and the $MoO_X$ film 202. The MoON film is a barrier metal layer containing molybdenum.

As described above, in the embodiment, the MoSiON film 121 and the MoON film 122 are used as the barrier metal layer. Any of the MoSiON film 121, the MoON film 122, and the molybdenum layer has low resistance. According to the embodiment, it is possible to realize a contact plug with low resistance.

Molybdenum is relatively inexpensively available. Thus, according to the embodiment, it is possible to realize a contact plug with low cost. Any of the barrier metal layers 121, 122 and the plug material layer 123 is mainly based on molybdenum. According to the embodiment, it is possible to further reduce the cost of the contact plug.

In the embodiment, the MoN film 201 and the $MoO_X$ film 202 are formed in this order on the bottom surface and the side surface of the contact hole $H_1$, and the barrier metal layers 121, 122 are formed from the MoN film 201 and the $MoO_X$ film 202. Thus, according to the embodiment, it is possible to suppress forming a SiN film between the substrate 101 and the plug material layer 123.

In the embodiment, the plug material layer 123 may be formed of a material other than molybdenum (Mo). As such a material, relatively inexpensively available copper (Cu), aluminum (Al), and tungsten (W) may be used. For example, when the structure of FIG. 2 is employed, it is preferable that the plug material layer 123 be formed of copper or aluminum. As other examples of the material for the plug material layer 123, ruthenium (Ru) and tantalum (Ta) may be used. The plug material layer 123 may be formed of single metal or may be formed of alloy.

The substrate 101 may be a semiconductor substrate other than a silicon substrate. When the substrate 101 is the SOI substrate, the semiconductor layer of the SOI substrate may be a semiconductor layer other than the silicon layer. As an example of the semiconductor which composes the semiconductor substrate and the semiconductor layer, silicon germanium (SiGe) may be used.

Figure 7:
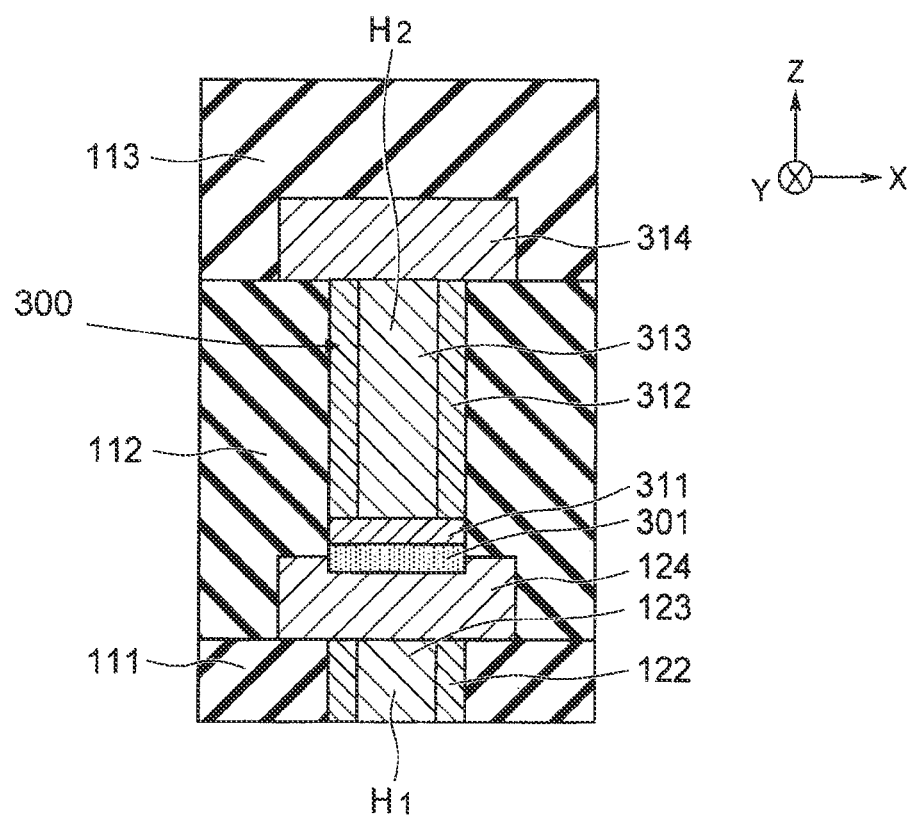
FIG. 7 is a cross-sectional view illustrating a semiconductor device of a second embodiment.

FIG. 7 illustrates a structure of a semiconductor device of a second embodiment, which focuses a via-plug constituting the semiconductor device.

The semiconductor device of FIG. 7 has a molybdenum (Mo) containing layer 301, a MoSiON film 311, a MoON film 312, a plug material layer 313, a wiring layer 314, and an interlayer insulating film 113, in addition to the configuration of the contact plug 100 illustrated in FIG. 1. A via-plug 300 is composed of the molybdenum (Mo) containing layer 301, the MoSiON film 311, the MoON film 312, and the plug material layer 313.

In FIG. 7, a via-hole $H_2$ is formed in an interlayer insulating film 112. The via-hole $H_2$ is formed to reach a wiring layer 124. The wiring layer 124 is, for example, a polysilicon layer. The wiring layer 124 is a conductive layer.

The molybdenum containing layer 301 is formed to extend into a surface portion of the wiring layer 124 from a bottom portion of the via-hole $H_2$. The molybdenum containing layer 301 may be a $MoSi_X$ layer.

Each of the MoSiON film 311 and the MoON film 312 is formed on the bottom portion and on a side surface of the via-hole $H_2$. The MoSiON film 311 and the MoON film 312 are a barrier metal layer containing molybdenum.

The plug material layer 313 is formed in the via-hole $H_2$ via the MoSiON film 311 and the MoON film 312. The plug material layer 313 is, for example, a molybdenum (Mo) layer.

The wiring layer 314 is formed on the plug material layer 313 and the interlayer insulating film 112. The wiring layer 314 is, for example, a copper (Cu) layer or an aluminum (Al) layer. The wiring layer 314 is covered with the interlayer insulating film 113.

As described above, the via-plug 300 of FIG. 7 has the same structure as that of the contact plug 100 of FIG. 1. Thus, according to the embodiment, it is possible to realize a via-plug with low resistance and low cost, similarly to the first embodiment. The semiconductor device of the embodiment can be manufactured by the same manufacturing method as that of the semiconductor device of the first embodiment.

The via-plug 300 of the embodiment may have the same structure as that of the contact plug 100a of FIG. 2.

The wiring layer 124 of the embodiment may be the semiconductor layer other than the silicon layer, similarly to the case of the substrate 101 of the first embodiment. The wiring layer 124 of the embodiment may be a laminated film including a metal layer and a semiconductor layer formed on the metal layer.

Figure 8:
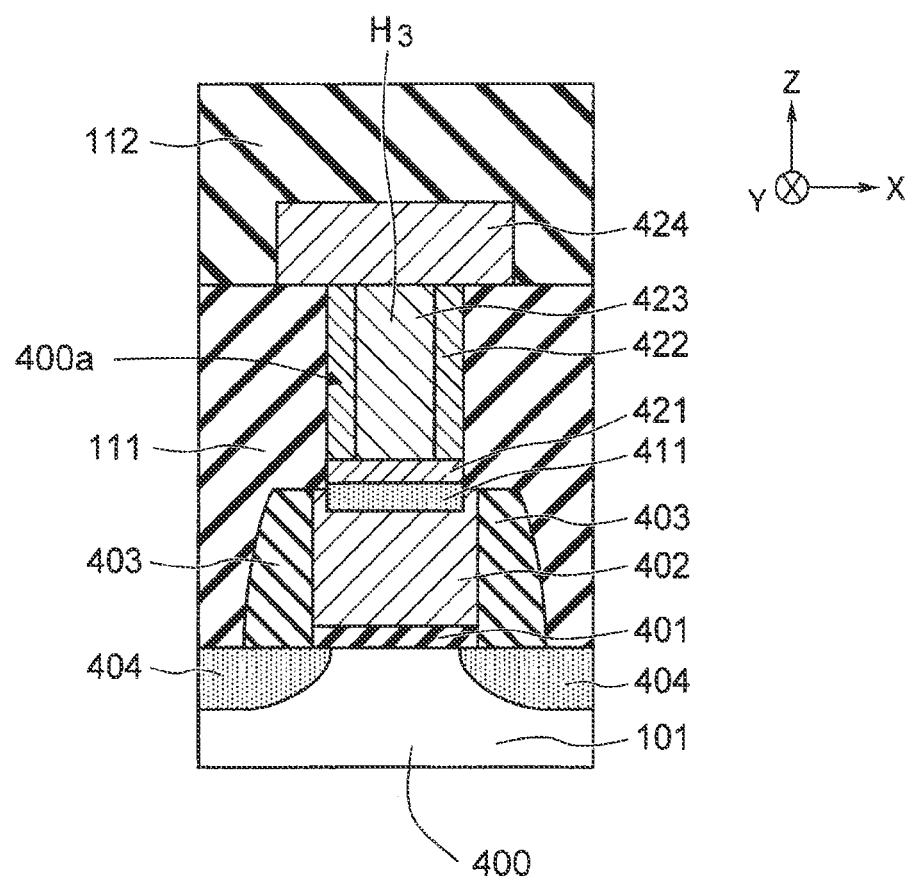
FIG. 8 is a cross-sectional view illustrating a semiconductor device of a third embodiment.

FIG. 8 illustrates a structure of a semiconductor device of a third embodiment, which focuses a portion including a contact plug (a gate contact) constituting the semiconductor device.

The semiconductor device of FIG. 8 has a MOSFET 400 having a gate insulating film 401, a gate electrode 402, a side wall insulating film 403, and a source/drain diffusion layers 404, a molybdenum containing layer 411, a MoSiON film 421, a MoON film 422, a plug material layer 423, and a wiring layer 424, in addition to the configuration of the semiconductor device illustrated in FIG. 1. The configuration of the semiconductor device of FIG. 1 is not illustrated in FIG. 8 partially. A via-plug 400a is composed of the molybdenum containing layer 411, the MoSiON film 421, the MoON film 422, and the plug material layer 423.

The gate electrode 402 is formed on a substrate 101 via the gate insulating film 401. The gate electrode 402 is, for example, a polysilicon layer. The gate electrode 402 is a conductive layer. The side wall insulating film 403 is formed on a side surface of the gate electrode 402. The source/drain diffusion layers 404 are formed in a substrate 101 so as to interpose the gate electrode 402. The MOSFET 400 of FIG. 8 is covered with an interlayer insulating film 111.

A contact hole $H_3$ is formed in the interlayer insulating film 111. The contact hole $H_3$ is formed to reach the gate electrode 402.

The molybdenum containing layer 411 is formed into a surface portion of the gate electrode 402 from a bottom portion of the contact hole $H_3$. The molybdenum containing layer 411 is, for example, a MoSi$_X$ layer.

The MoSiON film 421 and the MoON film 422 are formed on the bottom portion and on the side surface of the contact hole $H_3$, respectively. The MoSiON film 421 and the MoON film 422 are a barrier metal layer containing molybdenum.

The plug material layer 423 is formed in the contact hole $H_3$ via the MoSiON film 421 and the MoON film 422. The plug material layer 423 is, for example, a molybdenum layer.

The wiring layer 424 is formed on the plug material layer 423 and the interlayer insulating film 111. The wiring layer 424 is, for example, a copper (Cu) layer or an aluminum (Al) layer. The wiring layer 424 is covered with the interlayer insulating film 112.

As described above, the via-plug 400a of FIG. 8 has the same structure as that of the contact plug 100 of FIG. 1. Thus, according to the embodiment, similarly to the first embodiment, it is possible to realize a contact plug with low resistance and low cost. The semiconductor device of the embodiment can be manufactured by the same manufacturing method as that of the semiconductor device of the first embodiment.

The via-plug 400a of the embodiment may have the same structure as that of the contact plug of FIG. 2.

The gate electrode 402 of the embodiment may be a semiconductor layer other than a silicon layer, similarly to the case of the substrate 101 of the first embodiment. The gate electrode 402 of the embodiment may be a laminated film including a metal layer and a semiconductor layer formed on the metal layer.

Figure 9:
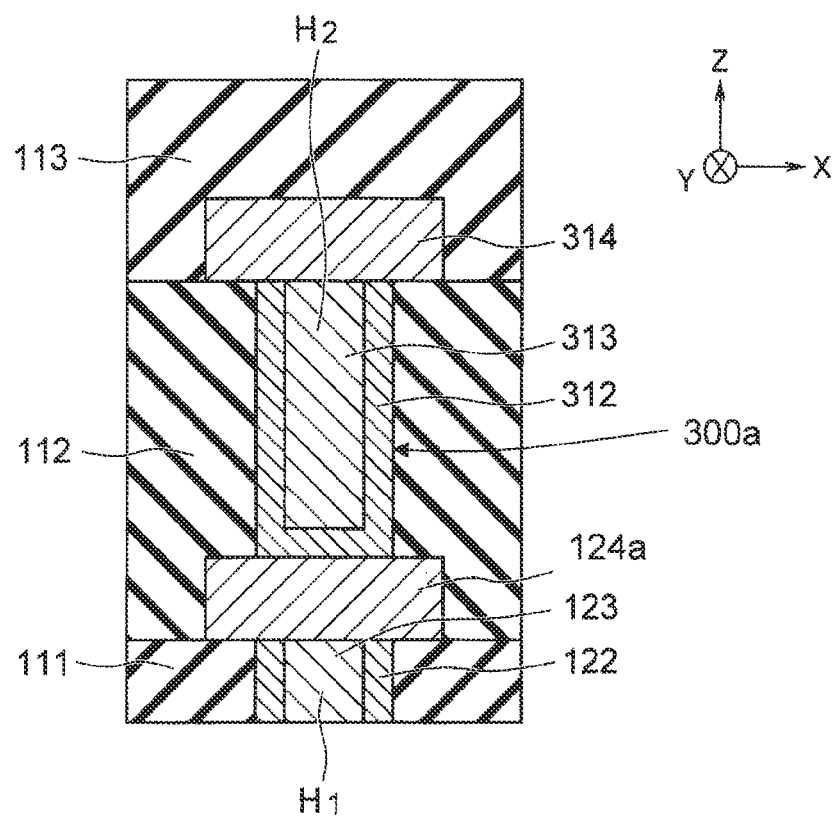
FIG. 9 is a cross-sectional view illustrating a semiconductor device of a fourth embodiment.

FIG. 9 illustrates a structure of a semiconductor device of a fourth embodiment, which focuses a via-plug constituting the semiconductor device.

A wiring layer 124a of FIG. 9 is different from the wiring layer 124 of FIG. 7, and is not a polysilicon layer but a metal layer. Accordingly, when the semiconductor device of FIG. 9 is manufactured, diffusion of silicon (Si) atoms from the wiring layer 124a to a MoON film 312 does not occur. As a result, the semiconductor device of FIG. 9 does not have a layer and a film corresponding to the molybdenum (Mo) containing layer 301 and the MoSiON film 311 shown in FIG. 7. According to the embodiment, it is possible to cover a bottom portion and a side surface of a contact hole $H_2$ with a barrier metal layer of the MoON film 312.

Various materials may be used as a metal material forming the wiring layer 124a. A molybdenum containing layer may be formed in the surface portion of the wiring layer 124 at the bottom portion of the contact hole $H_2$, depending on the kinds of the metal materials.

The wiring layer 124a may be, for example, a laminated film including a semiconductor layer and a metal layer formed on the semiconductor layer.

Figure 10:
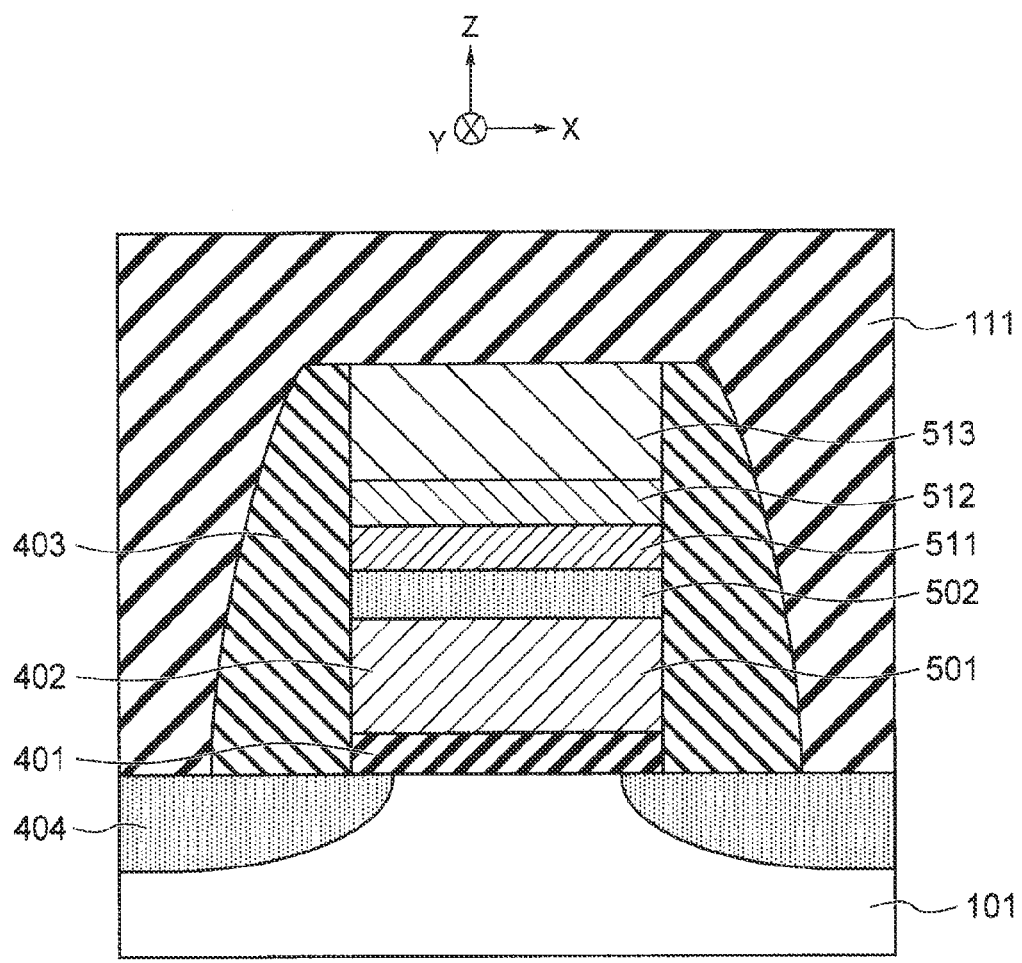
FIG. 10 is a cross-sectional view illustrating a semiconductor device of a fifth embodiment.

FIG. 10 illustrates a structure of a semiconductor device of a fifth embodiment, which focuses a MOSFET constituting the semiconductor device.

The semiconductor device of FIG. 10 has a substrate 101 and an interlayer insulating film 111, and a gate insulating film 401, a gate electrode 402, a side wall insulating film 403, and a source/drain diffusion layer 404 constituting the MOSFET.

As illustrated in FIG. 10, the gate electrode 402 includes a semiconductor layer 501 formed as a first electrode material, a MoSi$_X$ layer 502, a MoSiON film 511, a MoON film 512, and a metal layer 513 formed as a second electrode material. The gate electrode 402 is a laminated body serving as an electrode.

The semiconductor layer 501 is formed on the substrate 101 via the gate insulating film 401. The semiconductor layer 501 is, for example, a polysilicon layer. The gate electrode 402 of the embodiment is a poly-metal gate including a polysilicon layer 501 and a metal layer 513 as first and second electrode materials.

The MoSi$_X$ layer 502 is formed on a surface of the semiconductor layer 501. The MoSi$_X$ layer 502 is a molybdenum containing layer. The MoSiON film 511, the MoON film 512, and the metal layer 513 are formed in this order on the MoSi$_X$ layer 502. The MoSiON film 511 and the MoON film 512 are a barrier metal layer containing molybdenum. The metal layer 513 is, for example, a molybdenum (Mo) layer. As another example of the metal layer 513, a layer containing at least any one of Mo, Cu, Al, W, Ru, and Ta may be used.

As described above, in the embodiment, the barrier metal layer is composed of the MoSiON film 511 and the MoON film 512, and the metal layer 513 is a molybdenum layer. Any of the MoSiON film, the MoON film, and the metal layer 513 has low resistance. Thus, according to the embodiment, it is possible to realize a gate electrode with low resistance. Molybdenum is available at a relatively low cost. Thus, according to the embodiment, it is possible to realize a gate electrode at a low cost. Any of the MoSiON film 511 and the MoON film 512 as barrier metal layers and the metal layer 513 are mainly based on molybdenum. According to the embodiment, it is possible to further reduce the cost of manufacturing a gate electrode.

The structure of the gate electrode 402 of the embodiment as a laminated body may be also applied to a floating gate of a NAND-type memory, a control gate, or an interconnection of a ReRAM or a PCRAM with a cross-point structure.

A method of manufacturing method of the semiconductor device of the fifth embodiment will be described with reference to FIG. 11A to FIG. 11F.

FIGS. 11A to 11F are cross-sectional views illustrating the method of manufacturing the semiconductor device of the fifth embodiment.

Figure 11A:
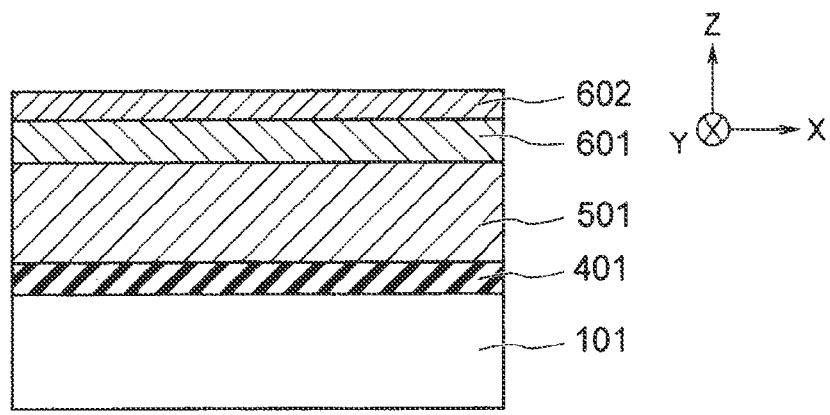
FIG. 11A to FIG. 11F are cross-sectional views illustrating steps of a method of manufacturing the semiconductor device according to the fifth embodiment.

As illustrated in FIG. 11A, a gate insulating film 401 is formed on a substrate 101 by thermal oxidation or CVD. The gate insulating film 401 is, for example, a silicon dioxide film. In addition, a semiconductor layer 501 is formed on the gate insulating film 401 by CVD. The semiconductor layer 501 is, for example, a polysilicon layer into which P-type impurities or N-type impurities are doped.

Then, a MoN film 601 is laminated on the semiconductor layer 501 by PVD, CVD or ALD. The surface of the MoN film 601 is oxidized to form a $MoO_X$ film 602 on a surface of the MoN film 601. The laminated film including the MoN film 601 and the $MoO_X$ film 602 is a barrier metal layer containing molybdenum.

The oxidation process for the surface of the MoN film 601 is performed at the same temperature as that of the lamination process of the MoN film 601, for example, at a temperature equal to or higher than 400° C. Hereinafter, a heat treatment at the oxidation process is referred to as a first heat treatment, similarly to the first embodiment.

Figure 11B:
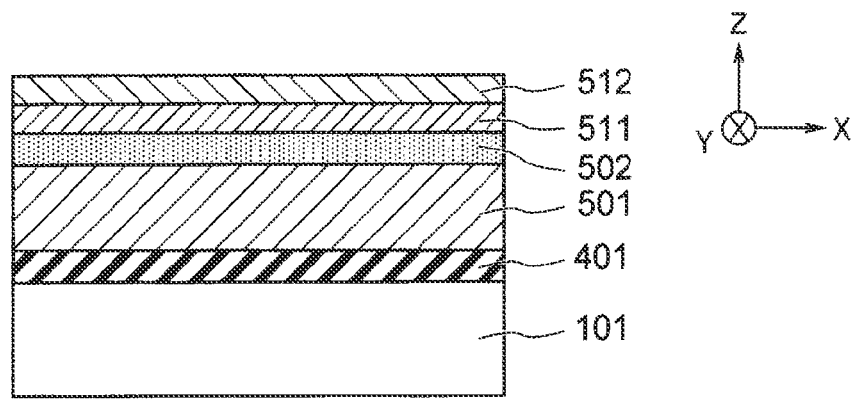

Then, as illustrated in FIG. 11B, a heat treatment for a substrate 101 is performed at a temperature higher than that of the first heat treatment, for example, at a temperature equal to or high than 500° C. As a result, a $MoSi_X$ layer 502 is formed between the semiconductor layer 501 and the barrier metal layer. The MoN film 601 and the $MoO_X$ film 602 are changed into the MoON film 512 by the heat treatment, and silicon contained in the semiconductor layer 501 is diffused into the MoON film 512. Consequently, a MoSiON film 511 is formed between the $MoSi_X$ layer 502 and the MoON film 512. Hereinafter, the treatment is referred to as a second heat treatment similarly to the first embodiment.

The first heat treatment and the second heat treatment may be integrated into one heat treatment similarly to the first embodiment.

Figure 11C:
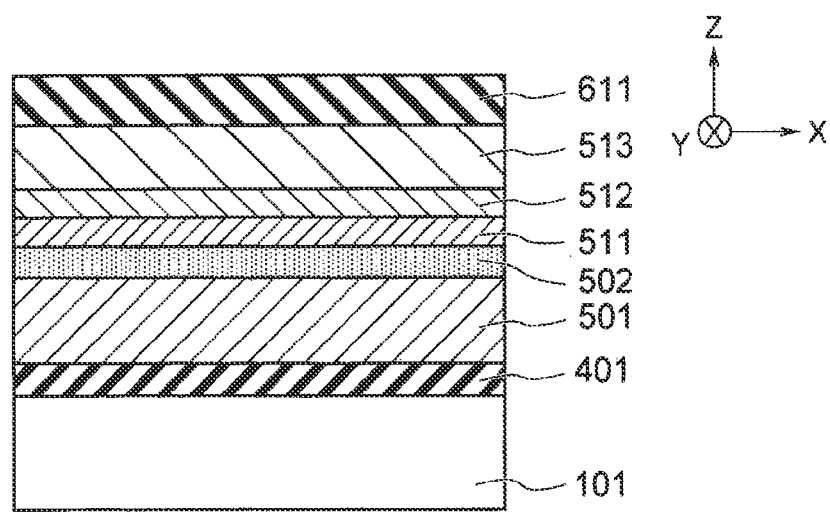

Then, as illustrated in FIG. 11C, a metal layer 513 is laminated on the MoON film 512 by CVD. In addition, a mask layer 611 is formed on the metal layer 513 by CVD. The mask layer 611 is, for example, a silicon nitride film.

Figure 11D:
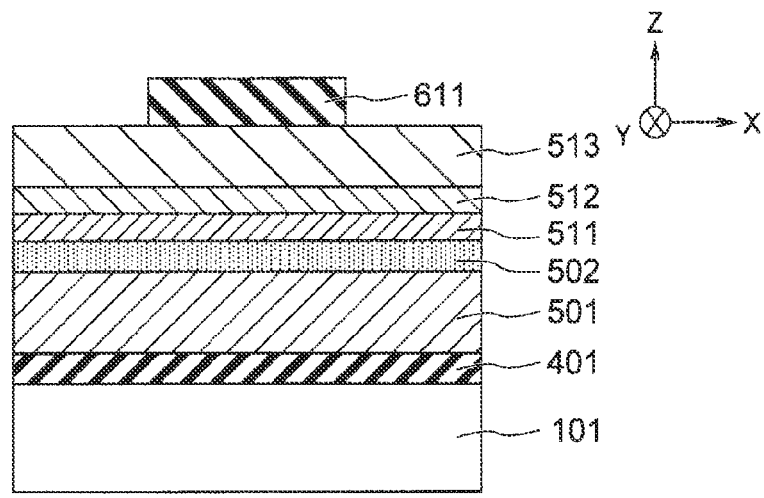

As illustrated in FIG. 11D, patterning of the mask layer 611 is performed by lithography and etching.

Figure 11E:
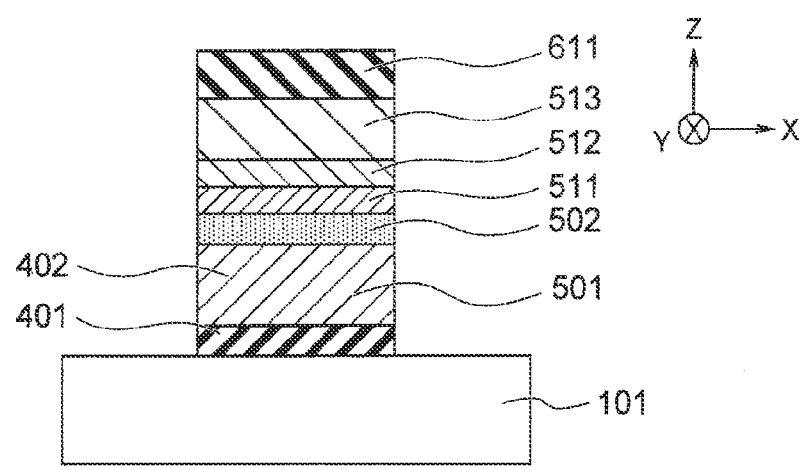

Then, as illustrated in FIG. 11E, the metal layer 513, the MoON film 512, the MoSiON film 511, the $MoSi_X$ layer 502, and the semiconductor layer 501, which are conductive layers, are etched using the mask layer 611. As a result, a gate electrode 402 which is composed of the laminated conductive layers is formed on the substrate 101 via the gate insulating film 401.

Figure 11F:
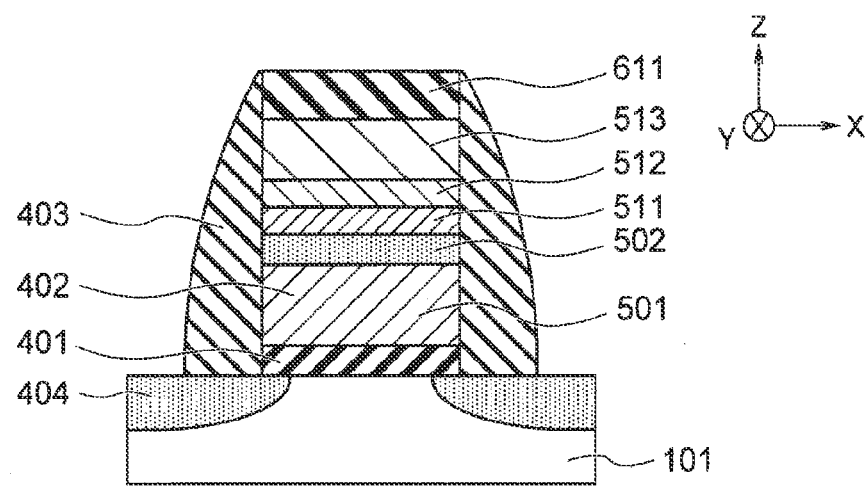

As illustrated in FIG. 11F, a side wall insulating film 403 is formed on a side surface of the gate electrode 402. Then, in addition, source/drain diffusion layers 404 are formed in a surface region of the substrate 101 so as to interpose the gate electrode 402.

Then, various contact plugs, via-plugs, wiring layers, and interlayer insulating films are formed. In such a manner, the semiconductor device of FIG. 10 is manufactured.

As described above, in the embodiment, the MoN film 601 and the $MoO_X$ film 602 are formed in this order on the semiconductor layer 501, and the barrier metal layer is formed by the MoN film 601 and the $MoO_X$ film 602. Thus, according to the embodiment, it is possible to suppress forming a SiN film between the semiconductor layer 501 and the metal layer 513.

A semiconductor other than silicon may be used as the semiconductor layer 501. A silicon germanium layer may be used as the semiconductor layer.

Modifications of a semiconductor device of the fifth embodiment will be described with reference to FIGS. 12A to 12C.

Figure 12A:
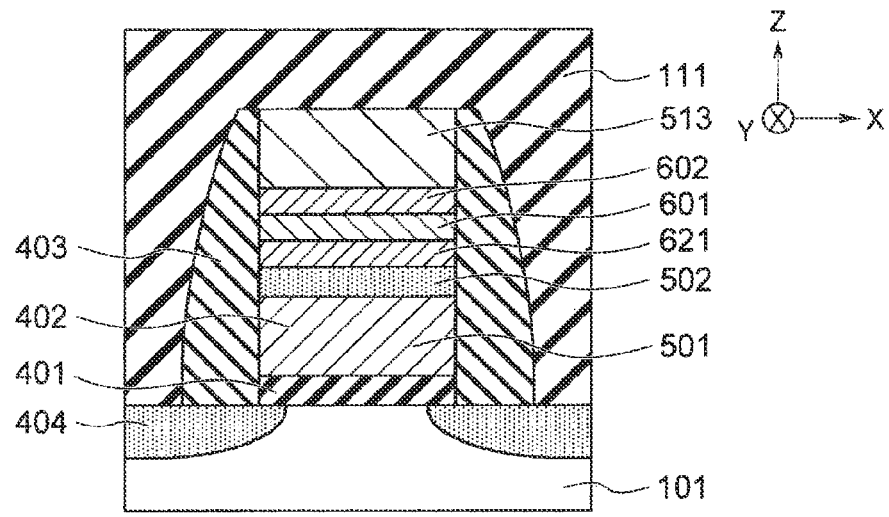
FIG. 12A to FIG. 12C are cross-sectional views illustrating semiconductor devices of respective modifications of the fifth embodiment.
Figure 12B:
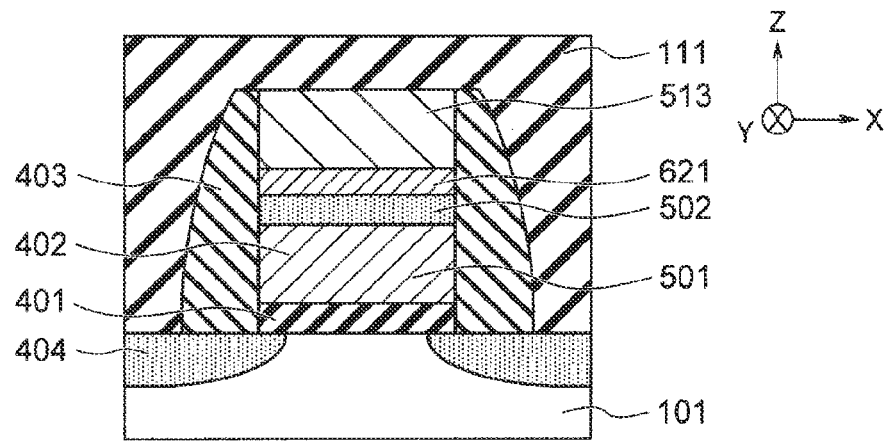
Figure 12C:
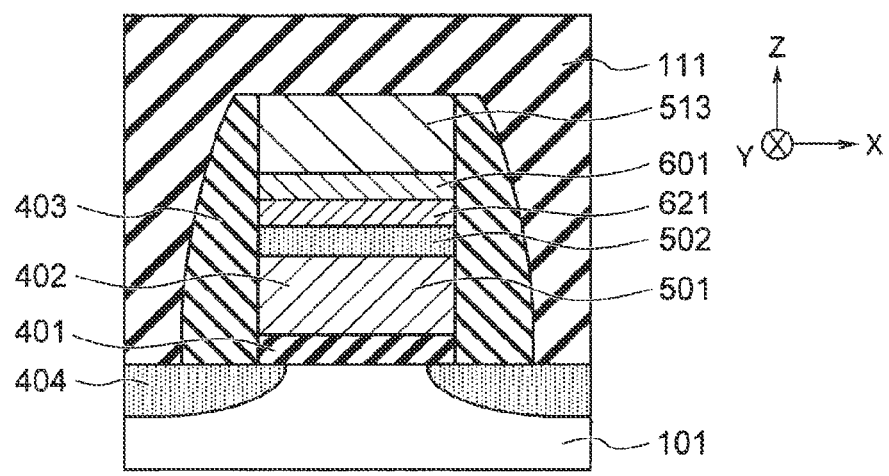

FIGS. 12A to 12C are cross-sectional views illustrating structures of the modifications of the fifth embodiment.

In FIG. 12A, a gate electrode 402 has a MoSiN film (a molybdenum silicon nitride film) 621, a MoN film 601 and a $MoO_X$ film 602 as conducive films between a $MoSi_X$ layer 502 and a metal layer 513. For example, the gate electrode 402 having the conductive films may be formed by performing the second heat treatment of FIG. 11B, under a condition in which change from the MoN film 601 and the $MoO_X$ film 602 into the MoON film 512 is suppressed. For example, in the step of FIG. 11B, the second heat treatment may be performed at 400 to 500° C. to form such the gate electrode 402. The MoSiN film 621 is formed by diffusion of silicon contained in the semiconductor layer 501 into the MoN film 601. The MoSiN film 621 is a barrier metal layer containing molybdenum.

In FIG. 12B, a gate electrode 402 has a MoSiN film 621 but does not include a MoN film 601 and a $MoO_X$ film 602, between the $MoSi_X$ layer 502 and the metal layer 513. The gate electrode 402 can be formed by performing the second heat treatment under the same condition as that of a method of manufacturing the semiconductor device of FIG. 12A, and then by performing a reduction treatment of the $MoO_X$ film 602 and a desorption treatment of molybdenum and nitrogen contained in the MoN film 601. Resistance of the gate electrode 402 of FIG. 12B may be lower than that of the gate electrode 402 of FIG. 12A.

In FIG. 12C, a gate electrode 402 has a MoSiN film 621 and a MoN film 601 but does not include a $MoO_X$ film 602, between a $MoSi_X$ layer 502 and a metal layer 513. The gate electrode 402 may be formed by performing the second heat treatment under the same condition as that of the method of manufacturing the semiconductor device of FIG. 12A and then by performing a reduction treatment of the $MoO_X$ film 602. Alternatively, the gate electrode 402 may be formed by performing the second heat treatment after forming the metal layer 513 without forming the $MoO_X$ film 602 in the step of FIG. 11B. Resistance of the gate electrode 402 of FIG. 12C can be lower than resistance of the gate electrode 402 of FIG. 12A.

Figure 13:
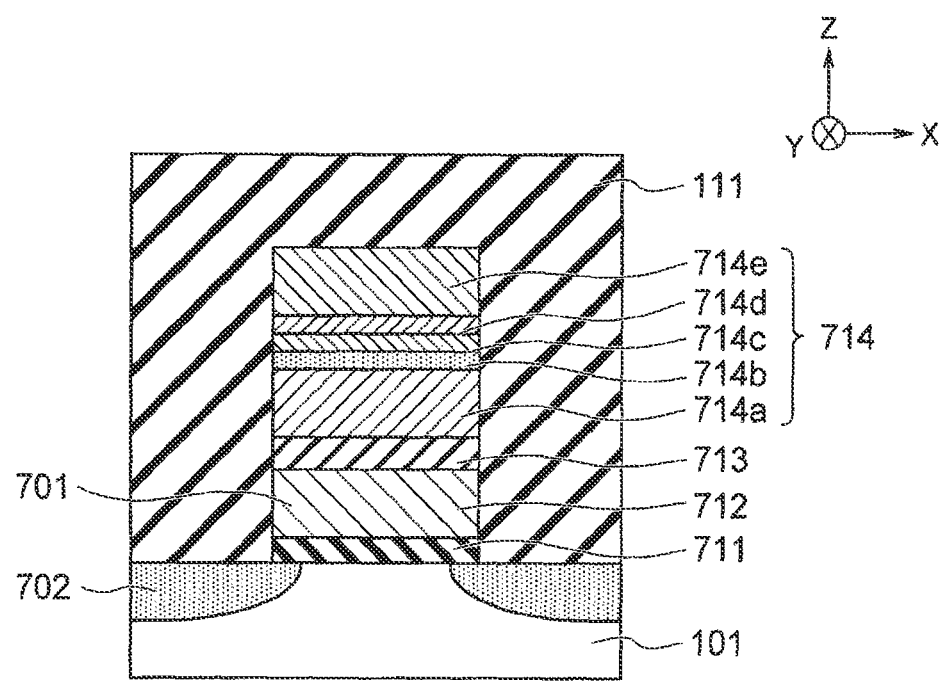
FIG. 13 is a cross-sectional view illustrating an modifications in which the semiconductor device of the fifth embodiment is applied to a NAND-type memory.

FIG. 13 illustrates an example in which the fifth embodiment is applied to a NAND-type memory. A semiconductor device of FIG. 13 has a substrate 101, an interlayer insulating film 111, a cell transistor 701, and a diffusion layer 702.

The cell transistor 701 includes a gate insulating film 711, a floating gate 712, an inter-gate insulating film 713 and a control gate 714 which are formed on the substrate 101 in this order. The control gate 714 includes a semiconductor layer 714a, a $MoSi_X$ layer 714b, a MoSiON film 714c, a MoON film 714d, and a metal layer 714e which are formed on the floating gate 712 via the inter-gate insulating film 713 in this order.

The control gate 714 is a laminated body serving as an electrode. As described above, the semiconductor device of the fifth embodiment may be also applied to the NAND-type memory.

In the fifth embodiment, the barrier metal layer containing molybdenum is formed between the semiconductor layer 501 and the metal layer 513 constituting an electrode or an interconnection. Thus, according to the embodiment, it is possible to provide an electrode or an interconnections with low resistance and low cost, similarly to the first to fourth embodiments.

The metal layer 513 may be the molybdenum (Mo) layer or any other than the molybdenum layer. However, when the metal layer 513 is the molybdenum layer, the molybdenum layer shows an advantage that a melting point is high. A melting point of the molybdenum layer is equal to or higher than 1000° C. Generally, as to a gate electrode of a DRAM or a NAND-type memory and a cross-point interconnection of a ReRAM or a PCRAM, it is required that the melting point is high, and thus it is appropriate to use the molybdenum layer as the metal layer 513.

When the metal layer 513 is formed, it is preferable to adjust an annealing condition of the metal layer 513 so as to increase diameters of crystal grains of the metal layer 513. By the adjustment of the annealing condition, it is possible to lower the resistance of the metal layer 513 further. Such adjustment may be also applied to the plug material layers 123, 313, 423 of the first to fourth embodiments.

The semiconductor devices according to the first to fourth embodiments and the modifications of the embodiments described above may be manufactured by forming an interlayer insulating film on a substrate containing silicon or on a conductive layer containing silicon formed on a substrate, forming a hole reaching the substrate or the conductive layer in the interlayer insulating film, forming a barrier metal layer containing molybdenum on a bottom surface and a side surface of the hole, forming a molybdenum containing layer in the substrate or the conductive layer at a bottom portion of the hole by a heat treatment of the substrate, diffusing silicon contained in the substrate or the conductive layer into the barrier metal layer at the bottom surface of the hole, and forming a plug material layer in the hole via the barrier metal layer.

The barrier metal layer formed on the bottom surface and the side surface of the hole is a laminated film including the molybdenum nitride film and the molybdenum oxide film. The molybdenum oxide film is formed by oxidizing a surface of the molybdenum nitride film at a temperature equal to or higher than 400° C. In this case, in the heat treatment for forming the molybdenum containing layer, the substrate may be heated at 500° C. or higher. The molybdenum oxide film can be formed by the heat treatment for forming the molybdenum containing layer.

For example, the semiconductor devices according to the fifth embodiment and the modifications of the fifth embodiment are manufactured by forming a semiconductor layer containing silicon as a first wiring material or as an electrode material on a substrate, forming a barrier metal layer containing molybdenum on the semiconductor layer, forming a molybdenum containing layer between the semiconductor layer and the barrier metal layer by a heat treatment of the substrate, diffusing silicon contained in the semiconductor layer into the barrier metal layer, forming a metal layer as a second wiring material or as an electrode material on the barrier metal layer, and processing the semiconductor layer, the molybdenum containing layer, the barrier metal layer and the metal layer so as to form a laminated body serving as an interconnection or an electrode.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate; and
   a laminated body formed on the substrate and serves as an interconnection or an electrode,
   wherein the laminated body includes
      a semiconductor layer containing silicon which is formed as a first wiring material or an electrode material above the substrate,
      a barrier metal layer which is formed on the semiconductor layer and contains molybdenum, and
      a metal layer which is formed on the barrier metal layer as a second wiring material or an electrode material,
   wherein the barrier metal layer includes a molybdenum silicate nitride film.

2. The semiconductor device according to claim 1, wherein the laminated body further includes a molybdenum containing layer between the semiconductor layer and the barrier metal layer.

3. The semiconductor device according to claim 2, wherein the molybdenum containing layer is a molybdenum silicide layer.

* * * * *